(12) United States Patent
Park (10) Patent No.: US 12,520,428 B2
(45) Date of Patent: Jan. 6, 2026

(54) POWER SUPPLY APPARATUS AND LAMP ASSEMBLY INCLUDING THE SAME

(71) Applicant: HYUNDAI MOBIS CO., LTD., Seoul (KR)

(72) Inventor: Sae Jun Park, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 350 days.

(21) Appl. No.: 18/354,778

(22) Filed: Jul. 19, 2023

(65) Prior Publication Data

US 2024/0172365 A1    May 23, 2024

(30) Foreign Application Priority Data

Nov. 21, 2022   (KR) ........................ 10-2022-0156124

(51) Int. Cl.
*H05K 1/18*  (2006.01)
*H05K 1/02*  (2006.01)
*H05K 1/14*  (2006.01)

(52) U.S. Cl.
CPC ........... *H05K 1/181* (2013.01); *H05K 1/0278* (2013.01); *H05K 1/028* (2013.01); *H05K 1/14* (2013.01); *H05K 2201/07* (2013.01); *H05K 2201/10113* (2013.01); *H05K 2201/10325* (2013.01)

(58) Field of Classification Search
CPC ...... H05K 1/181; H05K 1/0278; H05K 1/028; H05K 1/14
USPC ......................................................... 361/748
See application file for complete search history.

(56) References Cited

U.S. PATENT DOCUMENTS

| | | | |
|---|---|---|---|
| 2011/0304995 A1* | 12/2011 | Nakanishi | H05K 1/0269 361/748 |
| 2019/0348720 A1* | 11/2019 | Oh | H01M 50/567 |
| 2022/0190015 A1* | 6/2022 | Baik | H04N 25/00 |
| 2023/0371170 A1* | 11/2023 | Shin | H05K 9/0022 |

* cited by examiner

*Primary Examiner* — Binh B Tran
(74) *Attorney, Agent, or Firm* — NSIP Law (57) ABSTRACT

A power supply apparatus is provided. The power supply apparatus includes a flexible board including a first surface and a second surface disposed opposite to the first surface, a connecting terminal disposed on the first surface of the flexible board, and a fixing plate disposed on the second surface of the flexible board and disposed opposite to the connecting terminal.

17 Claims, 5 Drawing Sheets

POWER SUPPLY APPARATUS AND LAMP ASSEMBLY INCLUDING THE SAME

CROSS-REFERENCE TO RELATED APPLICATION(S)

This application claims priority to and the benefit of Korean Patent Application No. 10-2022-0156124, filed on Nov. 21, 2022, the disclosure of which is incorporated herein by reference in its entirety.

BACKGROUND

1. Field

The present invention relates to a power supply apparatus and lamp assembly including the same.

2. Description of Related Art

Generally, a lamp of a vehicle, more specifically, a head lamp of a vehicle, may include a plurality of light sources, a plurality of printed circuit boards (PCBs) coupled with light sources to control the plurality of light sources, a plurality of wires connected with an external device to supply power to the PCBs, and a lamp housing accommodating the light sources, the PCBs, the wires therein.

Since the wires are provided in a number corresponding to the number of light sources, the PCBs and the wires may be incorrectly assembled in a process of arranging the wires suitable for the light sources on the PCBs. This may be time consuming due to rearrangement of the wires.

In addition, since a large number of wires should be used to match the number of light sources, manufacturing costs are increased, and since an assembly process in which the wires are arranged on the PCBs is performed a long time, there is a problem that productivity is reduced.

Accordingly, the need for a configuration that can replace many wires is increasing.

SUMMARY

In an aspect of the disclosure, a power supply apparatus is disclosed. The power supply apparatus includes a flexible board including a first surface and a second surface disposed opposite to the first surface, a connecting terminal disposed on the first surface of the flexible board, and a fixing plate disposed on the second surface of the flexible board and disposed opposite to the connecting terminal.

The connecting terminal may be disposed at a position overlapping the fixing plate in a direction from the first surface to the second surface.

The flexible board may be provided in a rectangular shape, and the flexible board may include a first connection part on which the connecting terminal and the fixing plate are disposed, and a second connection part protruding from a part of the first connection part in a direction perpendicular to a direction in which the first connection part is disposed or protruding in the same arrangement direction as the direction in which the first connection part is disposed.

The first connection part of the flexible board may include first regions in which the connecting terminal and the fixing plate are disposed, and a second region disposed between the first regions to connect the first regions.

The power supply apparatus may further include a connecting module that connects the flexible board and an external device, and the connecting module may transmit power transmitted from the external device to the flexible board.

The flexible board may include a third connection part disposed at an end portion of the second connection part, and the flexible board may be connected to the connecting module.

The power supply apparatus may further include a support plate disposed on a surface of the third connection part on which the connecting module is not disposed, and the support plate may support the third connection part.

In another aspect of the disclosure, a lamp assembly is disclosed. The lamp assembly includes a rigid board on which a connecting socket is disposed, a heat sink supporting the rigid board, and a power supply apparatus connected to the rigid board to transmit power to the rigid board. The power supply apparatus may include a flexible board having a first surface and a second surface disposed opposite to the first surface, a connecting terminal disposed on the first surface of the flexible boar, and a fixing plate disposed on the second surface of the flexible board and disposed opposite to the connecting terminal.

The connecting terminal may be disposed at a position overlapping the fixing plate in a direction from the first surface to the second surface.

The rigid board may include a rigid printed circuit board (rigid PCB) coupled to the heat sink.

The flexible board may be provided in a rectangular shape and include a first connection part on which the connecting terminal and the fixing plate are disposed, and a second connection part protruding from a part of the first connection part in a direction perpendicular to a direction in which the first connection part is disposed.

The first connection part of the flexible board may include first regions in which the connecting terminal and the fixing plate are disposed, and a second region disposed between the first regions to connect the first regions.

The first region of the first connection part of the flexible board may be disposed on a connecting socket of the rigid board.

The power supply apparatus may further include a connecting module that connects the flexible board and an external device, and the power supply apparatus may transmit power transmitted from the external device to the flexible board.

The flexible board may include a third connection part disposed at an end portion of the second connection part, and the flexible board may be connected to the connecting module.

The rigid board may include a light source that emits light through power transmitted from the connecting socket, and the power supply apparatus may further include an integrated circuit disposed on the third connection part to control the light source.

The integrated circuit may include a processor, the integrated circuit may be connected to a circuit formed on the third connection part and the processor may be configured to control turn-on and turn-off of the light source of the rigid board connected to the power supply apparatus.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION

Since various modifications may be made in the present disclosure and various embodiments may be implemented, specific embodiments are illustrated in the drawings and described in the detailed description below. However, it should be understood that the present disclosure is not limited to particular embodiments and includes all modifications, equivalents, and alternatives falling within the spirit and scope of the present disclosure. In describing each drawing, like reference numerals are used for like elements.

Terms such as "first," "second," "A," "B," and the like may be used to describe various components but the components should not be limited by these terms. The terms are only used to distinguish one component from another. For example, without departing from the scope of the present disclosure, a first component may be referred to as a second component, and similarly, a second component may also be referred to as a first component. The term "and/or" includes a combination of a plurality of related items described herein or any one of the plurality of related items.

When a first component is referred to as being "coupled" or "connected" to a second component, it should be understood that the first component may be directly coupled or connected to the second component, or a third component may be interposed therebetween. In contrast, when a first component is referred to as being "directly coupled" or "directly connected" to a second component, it should be understood that no component is interposed therebetween.

In the description of the embodiments, when any one component is described as being formed "on (above) or under (below)" of another component, the on (above) or under (below) includes not only a case in which two components come into direct contact with each other but also a case in which one or more other components are (indirectly) disposed and formed between the two components. In addition, when expressed as "on (above) or under (below)," this may include the meaning of not only an upward direction but also a downward direction based on one component.

Terms used herein are only used to describe certain embodiments and are not intended to limit the present disclosure. As used herein, the singular expressions are intended to include plural forms as well, unless the context clearly dictates otherwise. It should be understood that the terms "comprise" and/or "comprising," when used herein, specify the presence of stated features, integers, steps, operations, elements, components, or a combination thereof, but do not preclude the presence or addition of one or more features, integers, steps, operations, elements, components, or a combination thereof.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having meanings consistent with meanings in the context of related technologies and should not be interpreted with ideal or excessively formal meanings unless explicitly defined herein.

Hereinafter, a power supply apparatus and a lamp assembly including the same will be described in more detail with reference to the accompanying drawings, components that are the same or correspond to each other will be denoted by the same reference numerals, and redundant description will be omitted.

Figure 1:
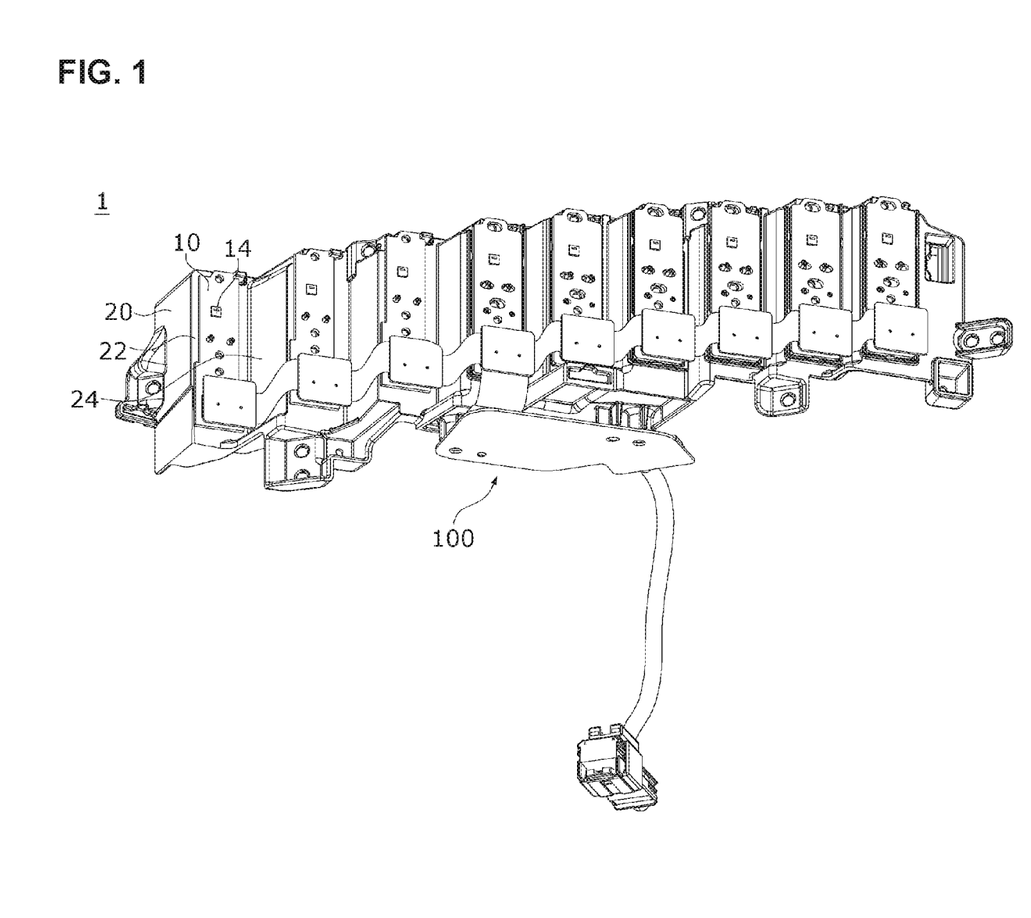
FIG. 1 is a bottom perspective view of a lamp assembly according to one embodiment of the present invention.
Figure 2:
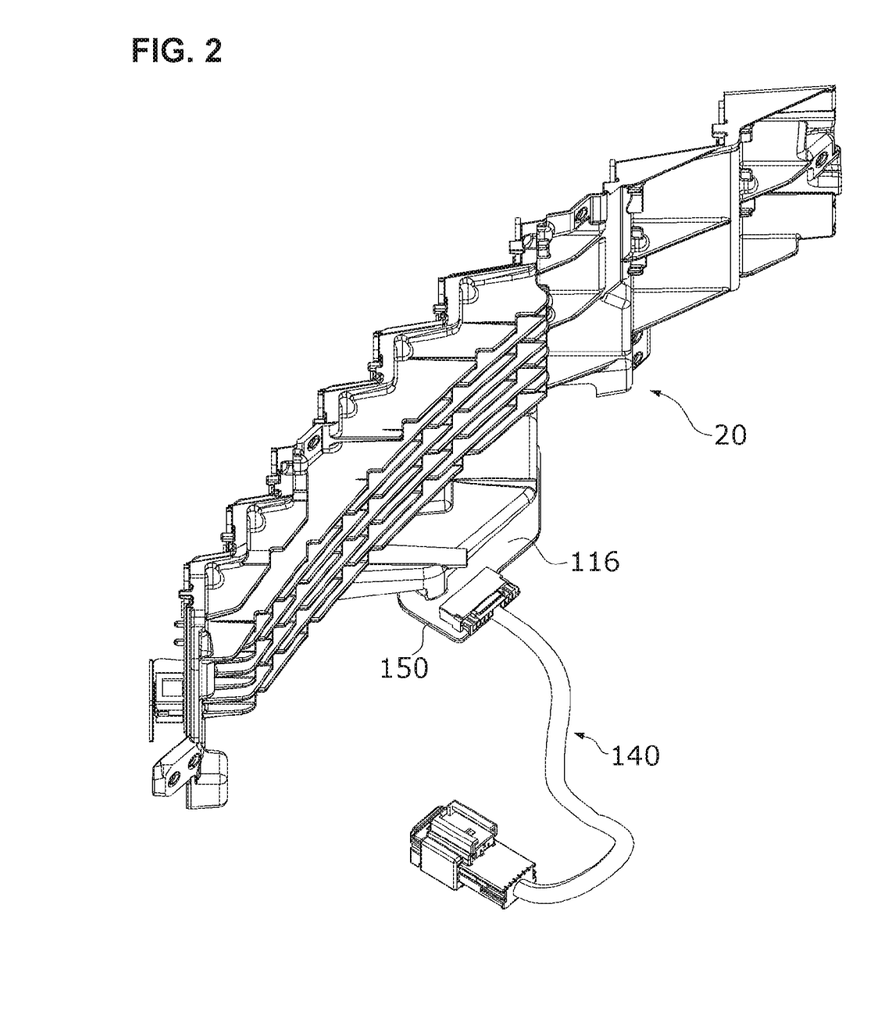
FIG. 2 is a rear perspective view of a lamp assembly according to one embodiment of the present invention.
Figure 3:
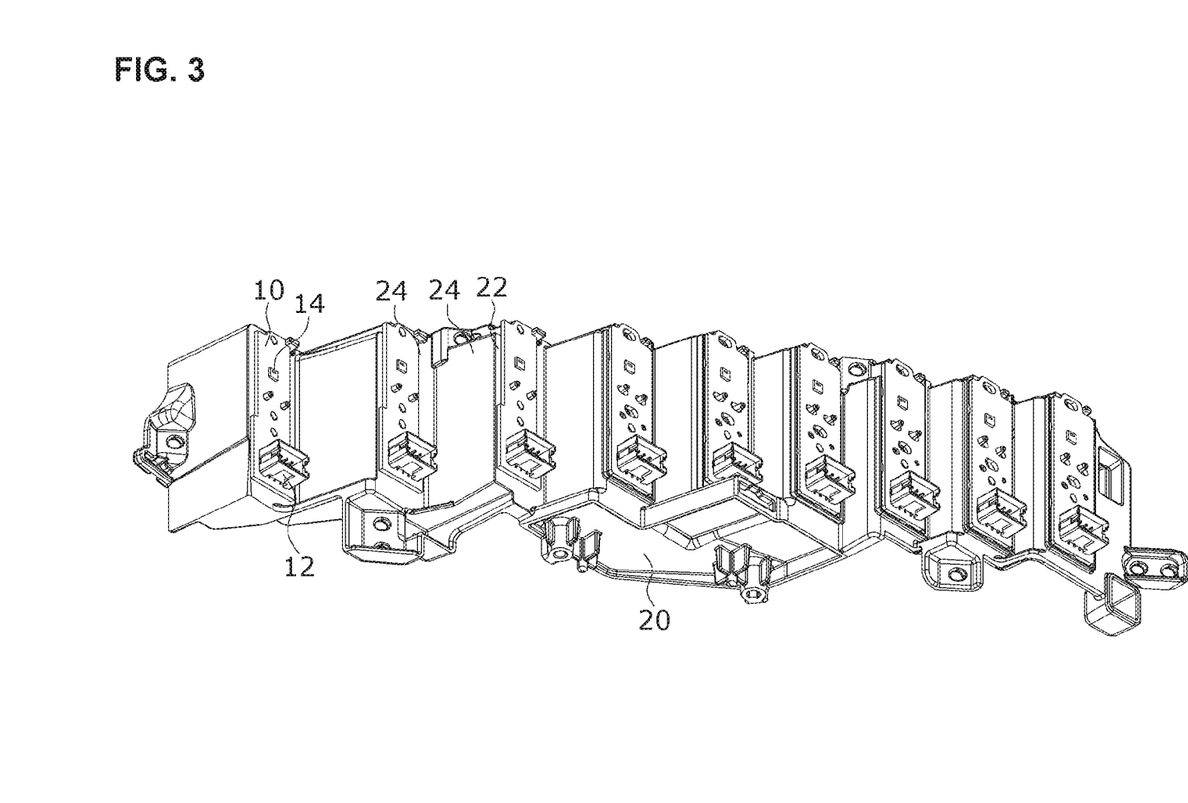
FIG. 3 is a view illustrating a rigid board coupled to a heat sink.
Figure 4:
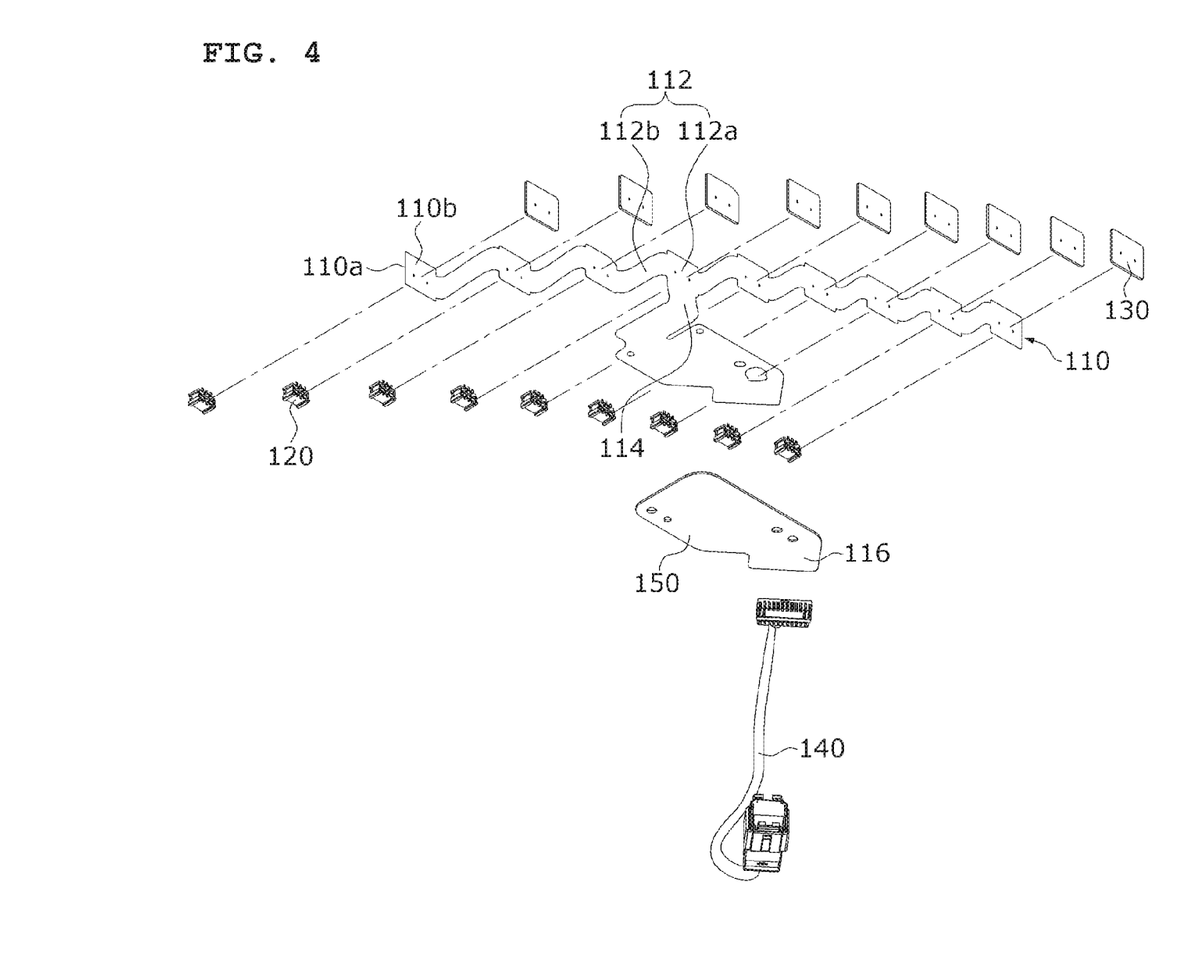
FIG. 4 is an exploded perspective view of a power supply apparatus.
Figure 5:
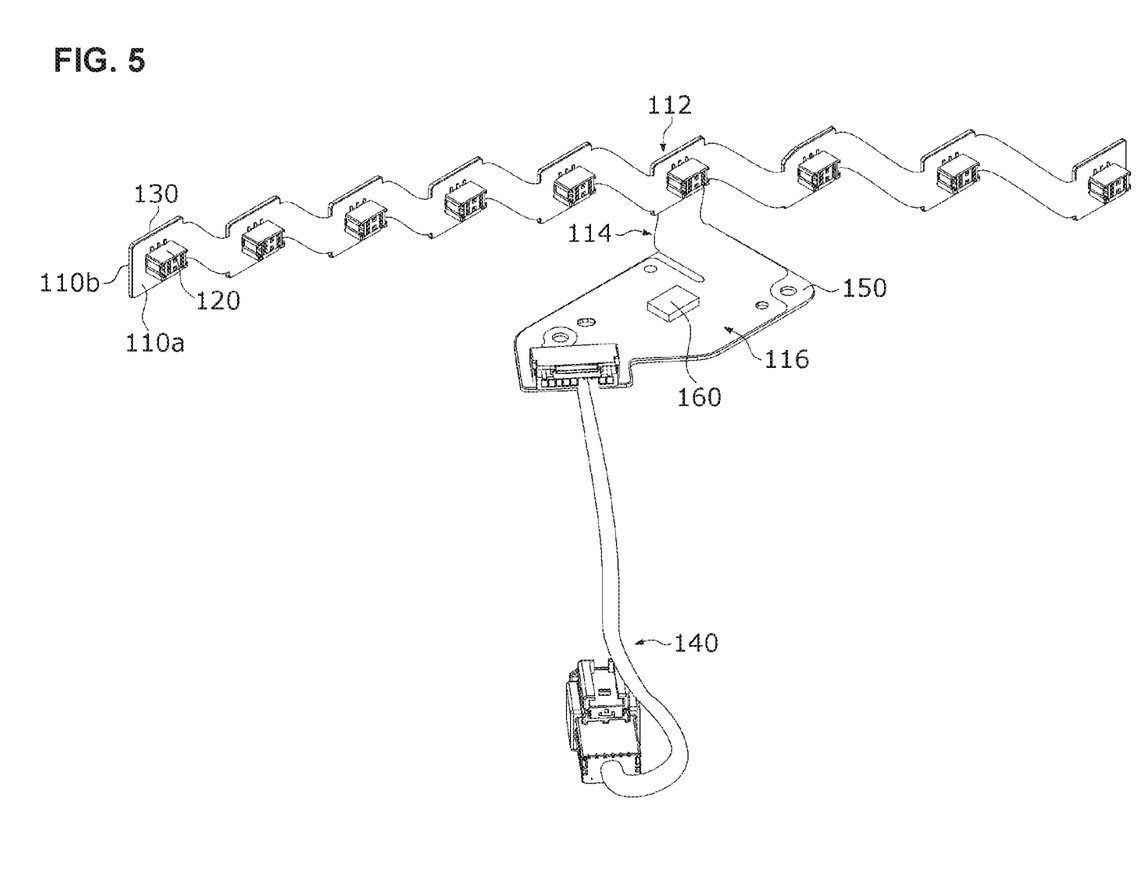
FIG. 5 is a rear perspective view of a power supply apparatus.

FIG. 1 is a bottom perspective view of a lamp assembly according to one embodiment of the present invention. FIG. 2 is a rear perspective view of a lamp assembly according to one embodiment of the present invention. FIG. 3 is a view illustrating a rigid board coupled to a heat sink. FIG. 4 is an exploded perspective view of a power supply apparatus. FIG. 5 is a rear perspective view of a power supply apparatus.

Referring to FIGS. 1 to 5, a lamp assembly 1 according to one embodiment of the present invention may be disposed inside a lamp, more specifically, inside a lamp housing of a head lamp of a vehicle. The lamp assembly 1 includes a rigid board 10 on which a connecting socket 12 is disposed, a heat sink 20 supporting the rigid board 10, and a power supply apparatus 100 connected to the rigid board 10 and transmitting power to the rigid board 10.

The rigid board 10 may include a rigid printed circuit board (rigid PCB). The rigid board 10 may have a rectangular shape. The rigid board 10 may be coupled to the heat sink 20. As shown in FIGS. 1 to 3, a plurality of rigid boards 10 are disposed on the heat sink 20, and the plurality of rigid boards 10 may be disposed on a seating surface 22 of the heat sink 20 to be described below.

The rigid board 10 may include a connecting socket 12 and a light source 14.

The connecting socket 12 may be disposed on one side of each rigid board 10. The connecting socket 12 may be disposed on a surface of the rigid board 10 opposite to a surface coupled to the seating surface 22 of the heat sink 20 to be described below. The connecting socket 12 may be connected to a connecting terminal 120 of the power supply apparatus 100 to be described below and may receive power transmitted through the connecting terminal 120.

The light source 14 is disposed on one side of each rigid board 10 and spaced apart from the connecting socket 12. The light source 14 may include a light emitting diode (LED). The light source 14 may emit light through the power transmitted to the connecting socket 12.

The heat sink 20 may support the rigid board 10 and dissipate the heat generated from the light source 14. The heat sink 20 may support a plurality of rigid boards 10. In the embodiment, as shown in FIGS. 1 to 3, one heat sink 20 is disposed in the lamp housing, but the present invention is not limited thereto. Two or more heat sinks 20 may be disposed in the lamp housing.

The heat sink 20 may include the seating surface 22 and an inclined surface 24.

As shown in FIG. 1, the seating surface 22 on which the rigid board 10 is seated may have a length in a longitudinal direction. In addition, a width of the seating surface 22 may correspond to a width of the rigid board 10. A protrusion may be formed on the seating surface 22 and coupled with the rigid board 10 to fix the rigid board 10. A plurality of seating surfaces 22 are provided, and the plurality of seating surfaces 22 may be spaced apart from each other.

The inclined surface 24 may be obliquely disposed from a widthwise end portion of the seating surface 22. The inclined surface 24 may connect the seating surfaces 22. A plurality of inclined surfaces 24 are provided, and the plurality of inclined surfaces 24 may be spaced apart from each other with the seating surfaces 22 interposed therebetween. The seating surface 22 and the inclined surface 24 may be arranged alternately in series.

In this embodiment, the heat sink 20 has been exemplified as having a shape in which the seating surface 22 and the inclined surface 24 are arranged alternately in series, but is not limited thereto. The heat sink 20 may have a shape without an inclined surface 24 so that the seating surfaces 22 are disposed to be collinear. Accordingly, a second region 112b of a first connection part 112 of the flexible board 110 to be described below may be disposed on the seating surface 22 or between the seating surfaces 22.

The power supply apparatus 100 may be connected to each of an external device and the rigid board 10 and transmit power transmitted from the external device to the rigid board 10. The power supply apparatus 100 may include a flexible board 110, a connecting terminal 120, a fixing plate 130, a connecting module 140, and a support plate 150.

The flexible board 110 may include a flexible PCB (FPCB) having a flexible material. The flexible board 110 may be disposed on one side of the rigid board 10. The flexible board 110 may include a first surface 110a on which a circuit is disposed and a second surface 110b which is opposite to the first surface 110a and on which a circuit is not disposed.

The flexible board 110 may include a first connection part 112, a second connection part 114, and a third connection part 116.

The first connection part 112 may be provided in a rectangular shape. The first connection part 112 may have a length from an outermost seating surface 22 of the heat sink 20 illustrated in FIG. 1 to the other outermost seating surface 22, but the present invention is not limited thereto. The connecting terminal 120 and the fixing plate 130 may be disposed on the first connection part 112.

The second connection part 114 may be disposed between the first connection part 112 and the third connection part 116 and connect the first connection part 112 and the third connection part. The second connection part 114 may protrude from a part of the first connection part 112 in a direction perpendicular to a direction in which the first connection part 112 is disposed or protrude in the same arrangement direction as the direction in which the first connection part is disposed.

The third connection part 116 may be disposed at an end portion of the second connection part 114. The third connection part 116 may be connected to the connecting module 140 and transmit power transmitted from the connecting module 140 to the second connection part 114.

The connecting terminal 120 may be disposed on the first surface 110a of the flexible board 110. The connecting terminal 120 may be coupled to the connecting socket 12 in a state in which the connecting terminal 120 is disposed on the first surface 110a of the flexible board 110. Due to the coupling between the connecting terminal 120 and the connecting socket 12, power is transmitted to the rigid board 10 and the light source 14 may emit light. The connecting terminal 120 may be disposed on each rigid board 10. The plurality of connecting terminals 120 may be provided so as to be coupled to a plurality of connecting sockets 12. The plurality of connecting terminals 120 may be spaced apart from each other on the first surface 110a of the flexible board 110. A distance between the connecting terminals 120 may correspond to a distance between the connecting sockets 12 of the rigid boards 10.

The fixing plate 130 may be disposed on the second surface 110b of the flexible board 110. The fixing plate 130 may be disposed opposite to the connecting terminal 120 in a state in which the fixing plate 130 is disposed on the second surface 110b. A plurality of fixing plates 130 may be provided, and the plurality of fixing plates 130 may be spaced apart from each other on the second surface 110b of the flexible board 110.

The fixing plate 130 may support the first connection part 112 of the flexible board 110 coupled to the connecting terminal 120 so that the connecting terminal 120 and the connecting socket 12 of the rigid board 10 are smoothly coupled. The fixing plate 130 may suppress the movement of the first connection part 112 of the flexible board 110 which is easily bent due to its soft nature. Accordingly, in a manufacturing process, the connecting terminal 120 may be smoothly handled by the fixing plate 130.

In addition, the fixing plate 130 may be disposed at a position overlapping the connecting terminal 120 in a direction from the first surface 110a to the second surface 110b. In addition, the connecting terminal 120 and the fixing plate 130 may be spaced apart from each other with the first connection part 112 of the flexible board 110 interposed therebetween. As a result, the fixing plate 130 disposed on the second surface 110b presses the flexible board 110 coupled to the connecting socket 12 of the rigid board 10 and the connecting terminal 120 disposed on the first surface 110a.

Accordingly, the fixing plate 130 may prevent the connecting terminal 120 from shaking, and thus the connecting socket and the connecting terminal 120 can maintain a stable coupling state. In addition, in order to stably transmit power transmitted from the flexible board 110 through the connecting module 140 to the connecting terminal 120, the fixing plate 130 may prevent the flexible board 110 from shaking.

The connecting module 140 may connect the flexible board 110 and the external device. More specifically, the connecting module 140 may be disposed on the third connection part 116 of the flexible board 110. In addition, the connecting module 140 may come into contact with the first surface 110a of the flexible board. Accordingly, power transmitted from the external device may be transmitted to the flexible board 110 through the connecting module 140.

The support plate 150 may be disposed on a surface of the third connection part 116 of the flexible board 110 on which the connecting module 140 is not disposed. More specifically, the support plate 150 may be coupled to the second surface 110b of the flexible board 110. The support plate 150 may support the third connection part 116. In addition, the support plate 150 may be coupled to the heat sink 20 in a state in which the support plate 150 supports the third connection part 116 of the flexible board 110. Accordingly, the third connection part 116 of the flexible board 110 may be fixed to the heat sink 20 by the support plate 150.

Hereinafter, the first connection part 112 of the flexible board 110 will be described in detail.

The first connection part 112 of the flexible board 110 may include a first region 112a and a second region 112b.

When the connecting terminal 120 of the power supply apparatus 100 is coupled to the connecting socket 12 of the rigid board 10 in the first region 112a, the first region 112a may be disposed on the rigid board 10. More specifically, the first region 112a may be disposed on the connecting socket 12 of the rigid board 10. The first region 112a may be disposed between the connecting terminal 120 of the power supply apparatus 100 and the fixing plate 130. The first region 112a may have a shape corresponding to an outer shape of the fixing plate 130, but the present invention is not limited thereto. A plurality of first regions 112a are provided, and a distance between the first regions 112a may correspond to a distance between the rigid boards 10. In addition, any one of the plurality of first regions 112a may be connected to the second connection part 114, but the present invention is not limited thereto.

The second regions 112b may be disposed between first regions 112a. The second region 112b may connect one first region 112a to another first region 112a adjacent to the one first region 112a.

The second region 112b may be obliquely disposed from an end portion of the first region 112a, but the present invention is not limited thereto. When the first region 112a is disposed on the rigid board 10, the second region 112b may be disposed on the inclined surface 24 of the heat sink 20. A width of the second region 112b may be smaller than a width of the first region 112a, but the present invention is not limited thereto.

In addition, the second region 112b which is disposed between the first regions 112a is tightened by the first regions 112a pressed by the fixing plates 130, and thus the second region 112b may be prevented from shaking. Accordingly, power transmitted to the third connection part 116 of the flexible board 110 through the connecting module 140 may be stably transmitted to the second region 112b through the first region 112a.

Unlike the conventional method in which a lamp assembly supplies power to the rigid board 10 using a plurality of wires, the lamp assembly 1 according to one embodiment of the present invention uses an integrated flexible board 110 to transmit power to the rigid board 10. Accordingly, the costs and time for providing a plurality of wires can be reduced and an assembling time for connecting the plurality of wires to the rigid boards 10 and the external device can be reduced.

In addition, since the lamp assembly 1 according to one embodiment of the present invention uses an integrated flexible board 110 rather than a plurality of conventional wires, misassembly occurring when the plurality of conventional wires are assembled to the rigid board 10 can be prevented.

Hereinafter, an integrated circuit (IC) 160 included in the power supply apparatus 100 will be described.

Referring to FIG. 5, the power supply apparatus 100 may further include the IC 160. The IC 160 is a complex electronic device with a subminiature structure in which a plurality of electronic circuit components are coupled on one board or coupled to one board itself in an inseparable state and the IC 160 may be disposed on the third connection part 116 of the flexible board 110. More specifically, the IC 160 may be coupled to the first surface 110a of the flexible board 110 on the third connection part 116 of the flexible board 110. The IC 160 may be connected to a circuit formed on the third connection part 116 and control the turn-on of the light source 14 of the rigid board 10 connected to the power supply apparatus 100.

In the embodiment, an example in which the IC 160 is coupled to the first surface 110a of the flexible board 110 on the third connection part 116 of the flexible board 110 is described, but the present invention is not limited thereto, and the IC 160 may be integrally provided on the third connection part 116 of the flexible board 110.

According to one embodiment of the present invention, a plurality of connecting terminals use an integrated FPCB which is separately arranged, a misassemble probability can be reduced in comparison with using a plurality of wire.

In addition, according to one embodiment of the present invention, costs for providing a plurality of wire can be reduced, an assembly process is simplified, and thus productivity can be improved.

Although the above description has been made with reference to embodiments of the present disclosure, those skilled in the art will be able to understand that the present disclosure may be variously modified and changed without departing from the spirit and scope of the present disclosure described in the appended claims. In addition, the differences related to these modifications and changes should be construed as being included in the scope of the present disclosure defined in the appended claims.

What is claimed is:

1. A power supply apparatus for a lamp assembly including a rigid board on which a connecting socket is disposed and a heat sink supporting the rigid board, the power supply apparatus comprising:
   a flexible board including a first surface and a second surface disposed opposite to the first surface;
   a connecting terminal disposed on the first surface of the flexible board; and
   a fixing plate disposed on the second surface of the flexible board and disposed opposite to the connecting terminal,
   wherein the power supply apparatus is connected to the rigid board to transmit power to the rigid board.

2. The power supply apparatus of claim 1, wherein the connecting terminal is disposed at a position overlapping the fixing plate in a direction from the first surface to the second surface.

3. The power supply apparatus of claim 2,
   wherein the flexible board is provided in a rectangular shape, and
   wherein the flexible board includes:
      a first connection part on which the connecting terminal and the fixing plate are disposed; and
      a second connection part protruding from a part of the first connection part in a direction perpendicular to a direction in which the first connection part is disposed or protruding in the same arrangement direction as the direction in which the first connection part is disposed.

4. The power supply apparatus of claim 3, wherein the first connection part of the flexible board includes:
   first regions in which the connecting terminal and the fixing plate are disposed; and
   a second region disposed between the first regions to connect the first regions.

5. A power supply apparatus comprising:
   a flexible board including a first surface and a second surface disposed opposite to the first surface;
   a connecting terminal disposed on the first surface of the flexible board;
   a fixing plate disposed on the second surface of the flexible board and disposed opposite to the connecting terminal; and
   a connecting module that connects the flexible board and an external device,
   wherein the connecting terminal is disposed at a position overlapping the fixing plate in a direction from the first surface to the second surface, wherein the flexible board is provided in a rectangular shape, and wherein the flexible board includes:
- a first connection part on which the connecting terminal and the fixing plate are disposed; and
- a second connection part protruding from a part of the first connection part in a direction perpendicular to a direction in which the first connection part is disposed or protruding in the same arrangement direction as the direction in which the first connection part is disposed, wherein the first connection part of the flexible board includes:
- first regions in which the connecting terminal and the fixing plate are disposed; and
- a second region disposed between the first regions to connect the first regions, wherein the connecting module transmits power transmitted from the external device to the flexible board.

6. The power supply apparatus of claim 5,
wherein the flexible board includes a third connection part disposed at an end portion of the second connection part, and
wherein the flexible board is connected to the connecting module.

7. The power supply apparatus of claim 6, further comprising:
a support plate disposed on a surface of the third connection part on which the connecting module is not disposed, and
wherein the support plate supports the third connection part.

8. A lamp assembly comprising:
a rigid board on which a connecting socket is disposed;
a heat sink supporting the rigid board; and
a power supply apparatus connected to the rigid board to transmit power to the rigid board,
wherein the power supply apparatus includes:
- a flexible board having a first surface and a second surface disposed opposite to the first surface;
- a connecting terminal disposed on the first surface of the flexible board; and
- a fixing plate disposed on the second surface of the flexible board and disposed opposite to the connecting terminal.

9. The lamp assembly of claim 8, wherein the connecting terminal is disposed at a position overlapping the fixing plate in a direction from the first surface to the second surface.

10. The lamp assembly of claim 8, wherein the rigid board comprises a rigid printed circuit board (rigid PCB) coupled to the heat sink.

11. The lamp assembly of claim 9, wherein the flexible board is provided in a rectangular shape and includes:
- a first connection part on which the connecting terminal and the fixing plate are disposed; and
- a second connection part protruding from a part of the first connection part in a direction perpendicular to a direction in which the first connection part is disposed.

12. The lamp assembly of claim 11, wherein the first connection part of the flexible board includes:
- first regions in which the connecting terminal and the fixing plate are disposed; and
- a second region disposed between the first regions to connect the first regions.

13. The lamp assembly of claim 12, wherein the first region of the first connection part of the flexible board is disposed on a connecting socket of the rigid board.

14. The lamp assembly of claim 11,
wherein the power supply apparatus further includes a connecting module that connects the flexible board and an external device, and
wherein the power supply apparatus transmits power transmitted from the external device to the flexible board.

15. The lamp assembly of claim 14,
wherein the flexible board includes a third connection part disposed at an end portion of the second connection part, and
wherein the flexible board is connected to the connecting module.

16. The lamp assembly of claim 15,
wherein the rigid board includes a light source that emits light through power transmitted from the connecting socket, and
wherein the power supply apparatus further includes an integrated circuit disposed on the third connection part to control the light source.

17. The lamp assembly of claim 16,
wherein the integrated circuit comprises at least one processor;
wherein the integrated circuit is connected to a circuit formed on the third connection part, and
wherein the at least one processor is configured to control turn-on and turn-off of the light source of the rigid board connected to the power supply apparatus.

* * * * *